(12) United States Patent
Hishiki et al.

(10) Patent No.: US 12,087,852 B2
(45) Date of Patent: Sep. 10, 2024

(54) COMPOUND SEMICONDUCTOR DEVICE, COMPOUND SEMICONDUCTOR SUBSTRATE, AND METHOD FOR MANUFACTURING COMPOUND SEMICONDUCTOR DEVICE

(71) Applicant: AIR WATER INC., Osaka (JP)

(72) Inventors: Shigeomi Hishiki, Nagano (JP); Keisuke Kawamura, Nagano (JP)

(73) Assignee: Air Water Inc., Osaka (JP)

( * ) Notice: Subject to any disclaimer, the term of this patent is extended or adjusted under 35 U.S.C. 154(b) by 693 days.

(21) Appl. No.: 17/290,145

(22) PCT Filed: Oct. 30, 2019

(86) PCT No.: PCT/JP2019/042524
§ 371 (c)(1),
(2) Date: Apr. 29, 2021

(87) PCT Pub. No.: WO2020/090870
PCT Pub. Date: May 7, 2020

(65) Prior Publication Data
US 2022/0005945 A1  Jan. 6, 2022

(30) Foreign Application Priority Data

Nov. 1, 2018 (JP) .................................. 2018-206717

(51) Int. Cl.
*H01L 29/778* (2006.01)
*H01L 29/10* (2006.01)
(Continued)

(52) U.S. Cl.
CPC ...... *H01L 29/7786* (2013.01); *H01L 29/1075* (2013.01); *H01L 29/267* (2013.01);
(Continued)

(58) Field of Classification Search
CPC .................... H01L 29/7786; H01L 29/1075; H01L 29/267
See application file for complete search history.

(56) References Cited

U.S. PATENT DOCUMENTS 7,745,848 B1  6/2010  Rajagopal et al.
9,929,107 B1  3/2018  Birner et al.
(Continued)

FOREIGN PATENT DOCUMENTS

CN  108699687 A  10/2018
EP  3 366 807 A1  8/2018
(Continued)

OTHER PUBLICATIONS

Extended European Search Report mailed Apr. 7, 2022 in European Patent Application No. EP 19 87 8888.
(Continued)

*Primary Examiner* — Errol V Fernandes
(74) *Attorney, Agent, or Firm* — Wood, Phillips, Katz, Clark & Mortimer

(57) ABSTRACT

A compound semiconductor device, a compound semiconductor substrate, and a method for manufacturing of a compound semiconductor device. Compound semiconductor device 100 comprises Si substrate 1 which has a shape surrounding hole 21 when viewed in a plane, SIC layer 3 formed on top surface 1a of Si substrate 1 and covers hole 21, nitride layer 10 containing Ga formed on the top surface side of SiC layer 3, source electrode 13, drain electrode 15, and gate electrode 17 formed on the top surface side of nitride layer 10. The current flowing between source electrode 13 and drain electrode 15 can be controlled by the voltage applied to gate electrode 17. The Si substrate does not exist in the area RG where source electrode 13, drain
(Continued)

electrode 15, and gate electrode 17 overlap the area when viewed from the direction orthogonal to top surface 1a of Si substrate 1.

10 Claims, 12 Drawing Sheets

(51) Int. Cl.
*H01L 29/267* (2006.01)
*H01L 29/66* (2006.01)
*H01L 29/16* (2006.01)
*H01L 29/167* (2006.01)
*H01L 29/20* (2006.01)
*H01L 29/205* (2006.01)

(52) U.S. Cl.
CPC .. *H01L 29/66068* (2013.01); *H01L 29/66462* (2013.01); *H01L 29/1608* (2013.01); *H01L 29/167* (2013.01); *H01L 29/2003* (2013.01); *H01L 29/205* (2013.01)

(56) References Cited

U.S. PATENT DOCUMENTS

| | | | |
|---|---|---|---|
| 2006/0170003 A1 | 8/2006 | Saito et al. | |
| 2006/0214289 A1 | 9/2006 | Hansen | |
| 2009/0267081 A1* | 10/2009 | Udagawa | H01L 21/02433 257/77 |
| 2015/0084103 A1 | 3/2015 | Okazaki et al. | |
| 2015/0294921 A1 | 10/2015 | Viswanathan et al. | |
| 2016/0060102 A1 | 3/2016 | Yang | |
| 2016/0260699 A1 | 9/2016 | Lehnert et al. | |
| 2018/0090455 A1 | 3/2018 | Brech et al. | |
| 2018/0277363 A1 | 9/2018 | Narukawa et al. | |

FOREIGN PATENT DOCUMENTS

| | | | | |
|---|---|---|---|---|
| EP | 3418424 A1 | * | 12/2018 | ............. C23C 16/04 |
| JP | 2004 342810 A | | 12/2004 | |
| JP | 2006-216671 A | | 8/2006 | |
| JP | 2007-087992 A | | 4/2007 | |
| JP | 2010 080633 A | | 4/2010 | |
| JP | 2010-098251 A | | 4/2010 | |
| JP | 2013-243275 A | | 12/2013 | |
| JP | 2017 150064 A | | 8/2017 | |
| TW | 201703261 A | | 1/2017 | |
| WO | 2017-069087 A1 | | 8/2018 | |

OTHER PUBLICATIONS

Partial Supplementary European Search Report issued Nov. 24, 2021 in European Application No. 19 878 888.7.
Office Action dated Jul. 4, 2023, in Taiwan Patent Application No. 108139634.
Office Action issued Jun. 14, 2022 in Japanese Patent Application No. JP2018-206717.
International Search Report, issued Dec. 17, 2019 in International Application No. PCT/JP2019/042524.
P. Srivastava et al., "Record Breakdown Voltage (2200V) of GaN DHFETs on Si With 2-μm Buffer Thickness by Local Substrate Removal", IEEE Electron Device Lett., vol. 32, No. 1, pp. 30-32, Jan. 2011.
International Search Report and Written Opinion, issued Apr. 27, 2021 in International Application No. PCT/JP2019/042524.
Office Action issued Oct. 4, 2022 in Japanese Patent Application No. JP2018-206717.
Office Action issued on Oct. 28, 2023, in Chinese Patent Application No. 201980072627.9.
Office Action issued Oct. 14, 2023, in Taiwan Patent Application No. 108139634.

* cited by examiner

COMPOUND SEMICONDUCTOR DEVICE, COMPOUND SEMICONDUCTOR SUBSTRATE, AND METHOD FOR MANUFACTURING COMPOUND SEMICONDUCTOR DEVICE

TECHNOLOGICAL FIELD

The present invention relates to a compound semiconductor device, a compound semiconductor substrate, and a method for manufacturing of a compound semiconductor device. More specifically, the present invention relates to a compound semiconductor device, a compound semiconductor substrate, and a method for manufacturing of a compound semiconductor device that can improve the mechanical strength.

DESCRIPTION OF THE RELATED ART

Due to the rapid development of mobile phones and the like, high-frequency and high-power wireless transmitters (satellite communication equipment, base stations, etc.) are required as next-generation wireless infrastructures. GaN (gallium nitride) has a higher dielectric breakdown electric field value and a higher saturation electron speed than Si (silicon). When a HEMT (High Electrons Mobility Transistor) is used as the device structure, the electron mobility of GaN is also high. For this reason, devices using GaN can have higher withstand voltage than conventional electron devices using Si, and are suitable for high output applications. GaN has a higher saturation electron speed than SiC (silicon carbide). When a HEMT (High Electrons Mobility Transistor) is used as the device structure, the electron mobility of GaN is also high. For this reason, GaN is being applied as high-frequency devices such as power transistors that are operated by high frequency signals and handle high power, and so on.

Especially, among high frequency devices used as base stations for mobile phones, the power and frequency of the communication machine are being high. Conventional high frequency devices using Si or GaAs (gallium arsenide) are approaching their physical limits. Therefore, the high frequency devices have been replaced by devices using GaN.

Currently, a SiC bulk substrate or a Si substrate is used as a foundation substrate when growing a GaN layer used as a high frequency device. Among high frequency devices, unintended parasitic capacitance and parasitic resistance may be formed between the foundation substrate and the surface electrode, which may impair the high frequency characteristics and cause power loss. If a foundation substrate is sufficiently high resistance or sufficiently low resistance, this high frequency characteristics degradation and the power loss tend to be small. However, they tend to be large in the intermediate resistance range. When a general Si substrate or a conductive SiC substrate is used as a foundation substrate, the specific resistance of the foundation substrate is within the range that causes the deterioration of high frequency characteristics, and the power loss becomes large.

To place the specific resistance of the foundation substrate in a range of small power loss, it is also possible to use a SiC substrate of semi-insulating or a Fz-Si substrate (a Si substrate grown as a single-crystal by floating zone melting (FZ) method) of high resistance as the foundation substrate. However, a SiC substrate of semi-insulating had a problem that it is difficult to be manufactured and the manufacturing cost is high, as compared to other substrates. When a high resistance Fz-Si substrate is used, there is a problem that high frequency characteristics is inferior to a semi-insulating SiC, especially under a high temperature operation.

Patent Documents 1 and 2 etc. below disclose technologies that can reduce parasitic capacity and parasitic resistance of high frequency devices and realize good high frequency characteristics. A semiconductor device is disclosed in Patent Document 1 below. A compound semiconductor region containing a buffer layer, an electron traveling layer, and an electron supply layer etc. is formed on a conductive SiC substrate. An opening consistent with an active region of the compound semiconductor region is formed on the conductive SiC substrate.

Patent Document 2 below discloses a method for manufacturing of a semiconductor device. A substrate which formed a SiC layer on a Si substrate is used, and elements are formed on this substrate. According to this method for manufacturing, the Si substrate is subsequently removed. After that, the SiC layer and another substrate other than the Si substrate are pasted together.

The non-patent document 1 below discloses a fact that a conventional device obtained by removing the conductive substrate part directly under the device has a size of several hundred micrometer squares. Patent Document 3 below discloses a compound semiconductor substrate. The compound semiconductor substrate comprises a Si substrate which has a ring-like planar shape and a SiC film which has a thickness of 20 nanometers or more and 10 micrometers or less formed on a principal surface of the Si substrate.

PRIOR ART DOCUMENT

Document(s) Related to Patents

[Patent Document1] Japanese published unexamined application No. 2010-98251
[Patent Document2] Japanese published unexamined application No. 2013-243275
[Patent Document3] Japanese published unexamined application No. 2017-150064
Non-Patent Document(s)
[Non-patent document 1] P. Strivastava et al., "Record Breakdown Voltage (2200 V) of GaN DHFETs on Si With 2-μm Buffer Thickness by Local Substrate Removal", IEEE Electron Device Lett., vol. 32, No. 1, pp. 30-32, Jan. 2011.

SUMMARY OF THE INVENTION

Problems to be Resolved by this Invention

However, when forming an opening on the conductive SiC substrate with the Patent Document 1 technology, there was a problem that it is difficult to drill a hole because the SiC is hard, the yield was low, and it took a long time to drill a hole.

The technology of Patent Document 2 had a problem that the yield at the time of manufacturing compound semiconductor devices is low. According to the technique of Patent Document 2, a method for manufacturing is disclosed as the first embodiment. Prior to a step which removes a Si substrate, a carry substrate is attached to a surface at the side of forming elements in order to secure the strength of the portion supporting the elements. After that, a support substrate is attached to a surface opposite to the surface on which the elements were formed. According to this first embodiment, in addition to the above-mentioned two attaching steps, a step for peeling the carry substrate is required, and there is a problem that steps become complicated.

Furthermore, in the technique of Patent Document 2, a method for manufacturing is disclosed as the second embodiment. A support substrate is attached to a surface opposite to the surface on which elements were formed prior to the step that removes the Si substrate, without attaching a carry substrate to the surface on which elements were formed. In this second embodiment, when the support substrate is attached, the part that supports the elements is temporarily only a SiC layer. For this reason, the mechanical strength of the elements decreases and the device layer is easily damaged in the above-mentioned attaching step.

The problem of low mechanical strength of the obtained compound semiconductor device and the problem of low manufacturing yield are not unique to compound. semiconductor devices for high frequency applications with GaN. These problems can occur in general compound semiconductor devices with a wide gap semiconductor layer including Ga (gallium) (such as $Ga_2O_3$ (gallium oxide)). Here, the wide gap semiconductor layer is defined as a semiconductor layer with a band gap of 2.2 eV or higher.

Further, the conventional technique has a problem that the mechanical strength of a compound semiconductor device is low, and a problem that the yield at the time of manufacturing is low as described above. For this reason, the size of conventional devices was on the order of hundreds of micrometer squares (see the above Non-patent document 1). It was difficult to realize a large-area device with the conventional technology.

The present invention is to solve the above problems. The object is to provide a compound semiconductor device, a compound semiconductor substrate, and a method for manufacturing of a compound semiconductor device that can improve its mechanical strength.

Another object of the present invention is to provide a compound semiconductor device, a compound semiconductor substrate, and a method for manufacturing of a compound semiconductor device which can improve the yield at the time of manufacture.

Yet another object of the present invention is to provide a compound semiconductor device, a compound semiconductor substrate, and a method for manufacturing of a compound semiconductor device that can realize large area devices.

SUMMARY OF THE INVENTION

According to an aspect of the invention, a compound semiconductor device comprises: a Si substrate with a shape that surrounds a hole when viewed in a plane, a covalent crystal layer formed on a top surface of the Si substrate and covering the hole, a wide gap semiconductor layer including Ga formed on a top surface side of the crystal layer, and a first, a second, and a third electrodes formed on a top surface side of the wide gap semiconductor layer, wherein current flowing between the first electrode and the second electrode can be controlled by voltage applied to the third electrode, and the Si substrate does not exist in a region that overlaps with the first, second, and third electrodes when viewed from a direction orthogonal to the top surface of the Si substrate.

Preferably, in the compound semiconductor device, the crystal layer has at least one crystal structure of a diamond structure, 2H hexagonal crystal, 3C cubic crystal, 4H hexagonal crystal, 6H hexagonal crystal, and 15R rhombohedral crystal.

Preferably, in the compound semiconductor device, the crystal layer consists of a crystal layer containing C or BN (boron nitride).

Preferably, in the compound semiconductor device, the crystal layer consists of 3C-SiC.

Preferably, in the compound semiconductor device, a top surface of the crystal layer is (111) plane.

Preferably, in the compound semiconductor device, the crystal layer consists of SiC which includes at least one of a N-type dopant such as nitrogen and phosphorus, a P-type dopant such as Al (aluminum) and B (boron), and transition metal as a dopant that plays semi-insulating, as impurity, and where concentration of N-type dopant is N (pieces/cm$^3$), concentration of P-type dopant is P (pieces/cm$^3$), and concentration of dopant that expresses semi-insulating is I (pieces/cm$^3$), any of the following equations (1) to (3) holds among the concentrations N, P, and I;

$$|N-P| \leq 1*10^{16} \tag{1}$$

$$N+P<I<1*10^{21} \tag{2}$$

$$1*10^{18} \leq |N-P| \leq 1*10^{21} \text{ and } I<N+P \tag{3}$$

Preferably, in the compound semiconductor device, the crystal layer have a specific resistance of 100 Ω cm or more or 100 m Ωcm or less.

Preferably, the compound semiconductor device further comprises a metal layer formed at a bottom of the hole.

Preferably, in the compound semiconductor device, the metal layer and the first electrode are electrically connected.

Preferably, the compound semiconductor device further comprises a Ga-free nitride layer formed between the crystal layer and the wide gap semiconductor layer.

According to another aspect, a compound semiconductor substrate comprises a Si substrate with a shape that surrounds multiple holes when viewed in a plane, and a covalent crystal layer formed on a top surface of the Si substrate and covering the holes, wherein the crystal layer exposed at a bottom of each of the holes is undamaged.

Preferably, the compound semiconductor substrate further comprises a wide gap semiconductor layer including Ga formed on a top surface side of the crystal layer.

Preferably, the compound semiconductor substrate further comprises a first, a second, and a third electrodes formed on a top surface side of the wide gap semiconductor layer for each of the multiple holes, wherein current flowing between the first electrode and the second electrode can be controlled by voltage applied to the third electrode, and the Si substrate does not exist in a region that overlaps with the first, second, and third electrodes when viewed from a direction orthogonal to the top surface of the Si substrate.

According to another aspect of the invention, a method for manufacturing of a compound semiconductor device comprises a step of forming a covalent crystal layer on a top surface of a Si substrate, a step of forming a wide gap semiconductor layer including Ga on a top surface side of the crystal layer, a step of forming a hole on a bottom surface of the Si substrate and exposing the crystal layer at a bottom of the hole, and a step of forming a first, a second, and a third electrodes on a top surface side of the wide gap semiconductor layer, wherein current flowing between the first electrode and the second electrode can be controlled by voltage applied to the third electrode.

Preferably, in the method for manufacturing, the step that exposes the crystal layer includes a step that etches a portion of the Si substrate, and the step that exposes the crystal layer is performed after the step that forms the wide gap semiconductor layer.

DETAILED DESCRIPTION OF EMBODIMENTS

Hereinafter, embodiments of the present invention will be described with reference to the drawings.

First Embodiment

Figure 1:
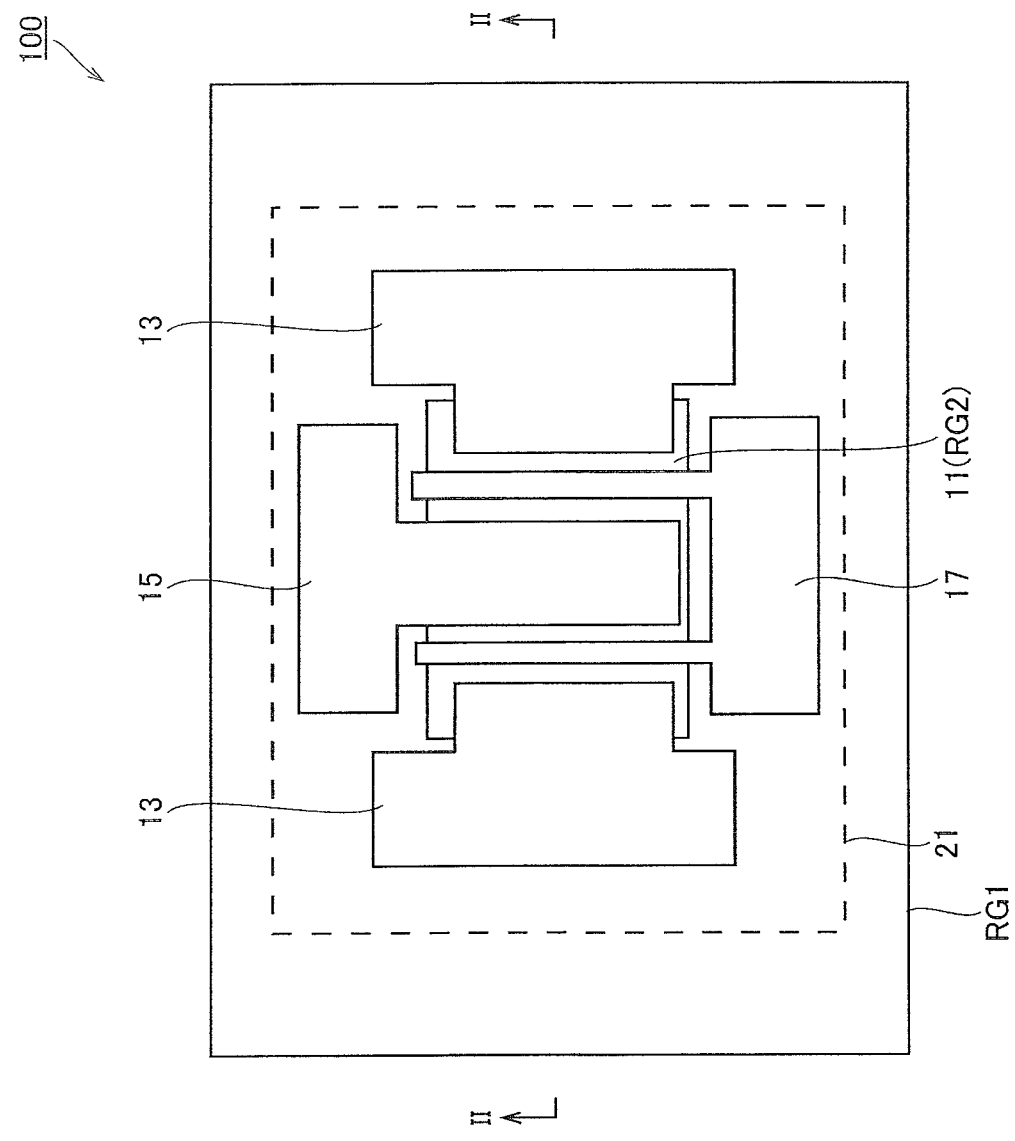
FIG. 1 shows a plane layout of each member of compound semiconductor device 100, when viewed from the direction orthogonal to top surface 1a of Si substrate 1, according to the first embodiment of the present invention.
Figure 2:
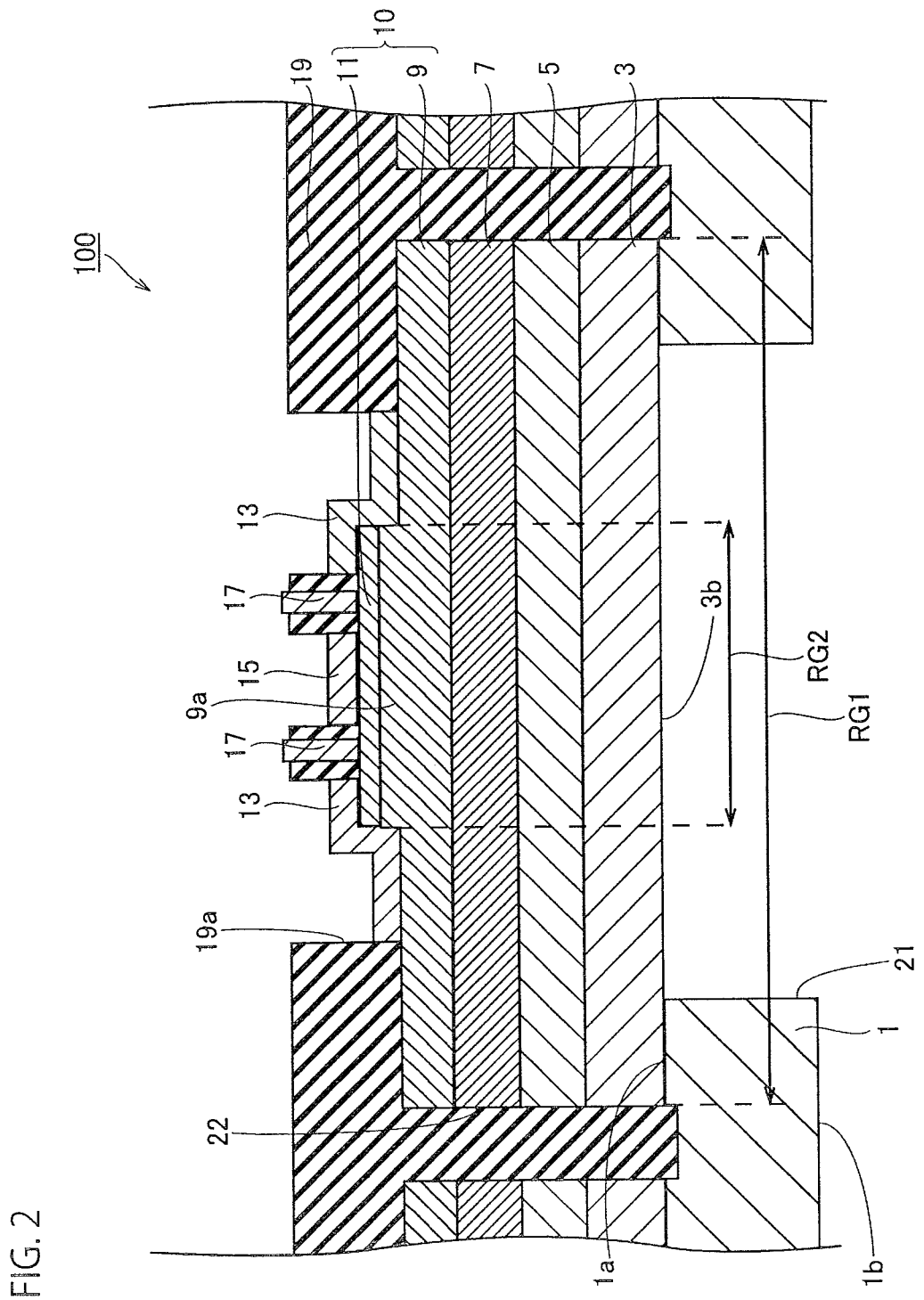
FIG. 2 shows a cross-sectional view showing the composition of compound semiconductor device 100 in the first embodiment of the present invention along the line II-II in FIG. 1.

FIG. 1 is a plan layout of each member of compound semiconductor device 100 in the first embodiment of the present invention, when viewed from a direction orthogonal to top surface 1a of Si substrate 1. FIG. 2 shows the cross-sectional view of the configuration of compound semiconductor device 100 in the first embodiment of the present invention, along the line II-II in FIG. 1.

With reference to FIGS. 1 and 2, the compound semiconductor device 100 (an example of a compound semiconductor device) in this embodiment includes a GaN-HEMT (High Electron Mobility Transistor) as a semiconductor device. This HEMT is preferably for high frequency applications (high frequency voltage of several gigahertz is applied to the gate electrodes). However, it goes without saying that the present invention can be applied to semiconductor devices other than high-frequency applications.

Compound semiconductor device 100 comprises Si substrate 1 (an example of a Si substrate), SiC layer 3 (an example of a crystal layer), AlN (aluminum nitride) buffer layer 5 (an example of a nitride layer that do not include Ga), AlGaN (aluminum gallium nitride) buffer layer 7, GaN layer 9, AlGaN layer 11, source electrode 13 (an example of a first electrode), drain electrode 15 (an example of a second electrode), gate electrode 17 (an example of a third electrode), and insulation layer 19. GaN layer 9 and AlGaN layer 11 make up Ga nitride layer 10 (an example of a wide gap semiconductor layer) which is a nitride layer including Ga. A HEMT is formed in Ga nitride layer 10.

When viewed planarly (from the direction orthogonal to top surface 1a of the Si substrate), Si substrate 1 has a ring-like planar shape that surrounds the hole (through hole) 21 (an example of a hole). A (111) plane is exposed on top surface 1a of Si substrate 1. The (100) or (110) plane may be exposed on the top surface 1a of Si substrate 1. The hole 21 may have any planar shape, may have a rectangular planar shape, or may have a circular planar shape. Assuming a circle with the same area as the bottom area of hole 21, this circle has a diameter of 1 millimeter or more and 50 millimeters or less, preferably 10 millimeters or less. The size of hole 21 may be determined according to the mechanical strength required for compound semiconductor device 100. Si substrate 1 has a thickness (length in the direction orthogonal to top surface 1a of the Si substrate) of 200 micrometers or more and 1.5 millimeters or less.

SiC layer 3 is in contact with Si substrate 1 and is formed on top surface 1a of Si substrate 1. SiC layer 3 covers hole 21, and bottom surface 3b of SiC layer 3 is exposed on the bottom of hole 21. SiC layer 3 is not formed on the side surface of hole 21 of Si substrate 1.

SiC layer 3 is preferably having at least one crystal structure among 2H (hexagonal crystal)-SiC, 3C (cubic crystal)-SiC, 4H (hexagonal crystal)-SiC, 6H (hexagonal crystal)-SiC and 15R (rhombohedral crystal)-SiC, for example. In particular, if SiC layer 3 was epitaxially grown onto top surface 1a of Si substrate 1, then typically, SiC layer 3 consists of 3C-SiC and the top surface of SiC layer 3 is (111) plane. The top surface of SiC layer 3 may be other than (111) plane such as (110) plane and (-1-1-1) plane. SiC layer 3 has a thickness of 20 nanometers or more and 10 micrometers or less. The thickness of SiC layer 3 is preferably 100 nanometers or more and 3.5 micrometers or less. The thickness of SiC layer 3 is more preferably 500 nanometers or more and 2 micrometers or less. SiC layer 3 consists of single-crystal 3C-SiC, but may contains poly crystal SiC or amorphous SiC in some areas.

SiC layer 3 is an example of a crystal layer. This crystal layer can be any covalent crystal layer. It may be a SiC layer, diamond, BN, etc. SiC and diamond are classified as a crystal layer including C. BN has a crystal structure such as a hexagonal crystal layer like structure, a cubic crystal sphalerite structure, or a hexagonal crystal wurtzite structure. From the viewpoint of improving high frequency characteristics, it is preferable that this crystal layer have a specific resistance of 100 Ω (ohm)cm or more or 100 m Ωcm or less. It is more preferable that this crystal layer have a specific resistance of 1000 Ωcm or more or 10 m Ωcm or less. It is further more preferable that this crystal layer have a specific resistance of 10000 Ωcm or more or 1 m Ωcm or less. It is further more preferable that this crystal layer have a specific resistance of 10000 Ω cm or more or 100 micro Ωcm or less. If the crystal layer has a specific resistance within the above range, parasitic capacity and parasitic resistance in compound semiconductor device 100 can be reduced, and high frequency characteristics of compound semiconductor device 100 is particularly good.

The crystal layer may consist of SiC, and one of the following equations (1) to (3) holds between the concentrations of dopants, wherein the SiC includes at least one of a N-type dopant such as nitrogen and phosphorus, a P-type dopant such as Al and B, and transition metal as a dopant that plays semi-insulating, as impurity, where N-type dopant concentration is N (pieces/cm$^3$), P-type dopant concentration is P (pieces/cm$^3$), and dopant concentration that expresses semi-insulating is I (pieces/cm$^3$). Examples of this transition metal include dopants such as Sc (scandium), Ti (titanium), V (vanadium), and Cr (chromium). Even if SiC is not intentionally doped, SiC usually contains a small amount of nitrogen as the environmental substance. This environmental substance nitrogen is also included in the above-mentioned dopants.

$$|N-P| \leq 1*10^{16} \quad (1)$$

$$N+P<I<1*10^{21} \quad (2)$$

$$1*10^{18} \leq |N-P| \leq 1*10^{21} \text{ and } I<N+P \quad (3)$$

The above equations (1) and (2) are the conditions to be satisfied when making the resistance of the SiC layer be increased, and the above equation (3) is the condition to be satisfied when making the resistance of the SiC layer be decreased.

AlN buffer layer 5 is in contact with SiC layer 3 and is formed on the top surface of SiC layer 3. AlN buffer layer 5 and AlGaN buffer layer 7 act as a buffer layer to mitigate the lattice constant value difference and thermal expansion coefficient difference between SiC layer 3 and GaN layer 9. AlN buffer layer 5 has a thickness of, for example, 5 nanometers or more and 2 micrometers or less, and more preferably 100 nanometers or more and 1 micrometer or less.

AlGaN buffer layer 7 is in contact with AlN buffer layer 5 and is formed on the top surface of AlN buffer layer 5. AlGaN buffer layer 7 has a thickness of, for example, 500 nanometers or more and 2 micrometers or less, and more preferably 900 nanometers or more and 2 micrometers or less. AlGaN buffer layer 7 may be omitted. Also, AlGaN buffer layer 7 may be replaced by another buffer structure such as a superlattice structure.

GaN layer 9 is in contact with AlGaN buffer layer 7 and is formed on the top surface of AlGaN buffer layer 7. GaN layer 9 has a mesa structure and contains protruding part 9a. It is preferable that impurity is not intentionally introduced near the boundary face with Al GaN layer 11 of GaN layer 9. The boundary face between GaN layer 9 and Al GaN layer 11 is the HEMT electronic traveling layer. GaN layer 9 has a thickness of, for example, 200 nanometers or more and 9 micrometers or less. GaN layer 9 more preferably has a thickness of 550 nanometers or more and 3 micrometers or less. AlN or AlGaN thin film layer(s) may be inserted into GaN layer 9 as appropriate. The total number of inserted layers is preferably 9 layers or less, more preferably 5 layers or less, and even more preferably 3 layers or less.

Al GaN layer 11 is in contact with the top surface of protruding part 9a of GaN layer 9 and is formed in the area (a second element separation area) RG2 partitioned by protruding part 9a. Al GaN layer 11 becomes a barrier layer of the HEMT. Al GaN layer 11 has a thickness of, for example, 10 nanometers or more and 50 nanometers or less, and more preferably 20 nanometers or more and 40 nanometers or less.

The lattice constant values of SiC and nitride including Ga is similar. Therefore, SiC layer 3 acts as a foundation layer for Ga nitride layer 10. Ga nitride layer 10 may be formed on the top surface side of SiC layer 3. In this embodiment, AlN buffer layer 5 and AlGaN buffer layer 7 are formed between SiC layer 3 and Ga nitride layer 10. The difference of lattice constant values and thermal expansion coefficients between SiC that composes SiC layer 3 and GaN that makes up GaN layer 9 are mitigated by AlN buffer layer 5 and AlGaN buffer layer 7. Note that AlN buffer layer 5 and AlGaN buffer layer 7 may be omitted, and Ga nitride layer 10 may be directly formed on the top surface of SiC layer 3.

Each of source electrode 13, drain electrode 15, and gate electrode 17 is formed on the top surface side of Ga nitride layer 10. Source electrode 13 and drain electrode 15 are formed at intervals on the top surface of AlGaN layer 11. Gate electrode 17 is formed between source electrode 13 and drain electrode 15 on the top surface of AlGaN layer 11. Each of source electrode 13, drain electrode 15, and gate electrode 17 extends to the top surface of GaN layer 9. Each of source electrode 13 and drain electrode 15 is in ohmic contact with AlGaN layer 11. Gate electrode 17 is in Schottky contact with, for example, AlGaN layer 11. Each of source electrode 13 and drain electrode 15 has a laminated structure of Ti (titanium) layer(s) and Al layer(s) stacked in order from the AlGaN layer 11 side, for example. Gate electrode 17 has a laminated structure of Ni (nickel) layer(s) and Au (gold) layer(s) stacked in order from the AlGaN layer 11 side, for example.

Separation trench 22 is formed between compound semiconductor device 100 and another adjacent compound semiconductor device. Compound semiconductor device 100 is electrically separated from the adjacent compound semiconductor device by separation trench 22. Each of the multiple compound semiconductor devices 100 is formed in the area (a first element separation area) RG1 partitioned by separation trenches 22. Separation trench 22 is formed to a depth from the top surface of insulation layer 19 to top surface 1a of Si substrate 1. The separation trench partitioning the compound semiconductor layer 100 is preferably formed to a depth that reaches the boundary between AlGaN layer 11 and GaN layer 9. It is even more preferred to reach a depth of AlGaN buffer layer 7. It is even more preferred to reach AlN buffer layer 5. It is even more preferred to reach SiC layer 3. It is even more preferably formed to a depth that reaches top surface 1a of Si substrate 1. Separation trench 22 does not necessarily have to be formed. Furthermore, insulation layer 19 does not necessarily have to be formed. Also, instead of forming separation trench 22, ion implantation may be performed on the nitride layer in the region, thereby increasing the resistance of the region and making the region a separating layer.

Insulation layer 19 is formed on GaN layer 9 and AlGaN layer 11 so as to fill within separation trench 22. An opening 19a is formed where it is required in insulation layer 19, and source electrode 13 and drain electrode 15 are exposed at the bottom of the opening 19a. Insulation layer 19 consists of, for example, SiN (silicon nitride) or SiO$_2$ (silicon oxide).

The thickness of each layer that makes up compound semiconductor device 100 is measured using, for example, a spectroscopic ellipsometer. The spectroscopic ellipsometer irradiates an object to be measured with incident light that is polarized light and receives reflected light from the object to be measured. There is a phase shift and a difference in reflectance between S-polarized light and P-polarized light. Therefore, the polarized light state of the reflected light is different from the polarized light state of the incident light. This change in the polarized light state depends on the wavelength of the incident light, the angle of incidence, the optical constant value of the film, and the film thickness. From the obtained reflected light, a spectroscopic ellipsometer calculates the optical constant value of the film and the film thickness based on the wavelength of the incident light and the angle of the incidence. Needless to say, the thickness of each layer can be measured by a spectroscopic reflection method, a cross-section SEM observation, or a cross-section TEM observation.

The operation of the HEMT in this embodiment is as follows. Source electrode 13 is always maintained at the ground potential (reference potential). Due to the difference in a band gap between GaN layer 9 and AlGaN layer 11 and the polarization and stress of AlGaN layer 11, when no voltage is applied to gate electrode 17, two-dimensional electron gas is formed on the heterojunction interface between GaN layer 9 and Al GaN layer 11. On the other hand, when a sufficient negative voltage is applied to gate electrode 17, the above-mentioned two-dimensional electron gas is excluded from the heterojunction interface of GaN layer 9 and AlGaN layer 11. As a result, no current flows from drain electrode 15 to source electrode 13. On the other hand, when positive voltage is applied to gate electrode 17, the electrical field effect increases the concentration of two-dimensional electron gas. This increases the current flowing from drain electrode 15 to source electrode 13. Therefore, the current flowing between source electrode 13 and drain electrode 15 can be controlled by the voltage applied to gate electrode 17.

Ga nitride layer 10 when a HEMT is formed may be any one containing a first nitride layer and a second nitride layer formed on the surface of the first nitride layer and having a band gap wider than the band gap of the first nitride layer. Ga nitride layer 10 when a HEMT is formed may consist of combination of nitride semiconductor materials other than the combination of GaN and AlGaN (for example, two type AlGaN layers with different Al composition ratios).

Referring to FIG. 1, as seen from the direction orthogonal to top surface 1a of Si substrate 1, hole 21 is provided in the area where source electrode 13, drain electrode 15, and gate electrode 17 overlap with the area (the area directly below the HEMT), and Si substrate 1 does not exist in the area. Thus, in compound semiconductor device 100, the Si substrate directly under the semiconductor device was removed.

A Si substrate metallizes at a temperature of only about 200 degrees Celsius. Hence, if a foundation Si substrate exists directly under the compound semiconductor device, and the semiconductor device generates heat during the operation of the compound semiconductor device, the specific resistance of the high resistance foundation Si substrate gradually decreases and passes through the range of a specific resistance where the power loss increases. For this reason, it is difficult to suppress power loss of the compound semiconductor device. However, according to compound semiconductor device 100 of this embodiment, such a Si substrate does not exist directly under compound semiconductor device 100. Therefore, even if the compound semiconductor device generates heat, power loss can be suppressed. This makes it possible to realize a HEMT with a good high frequency characteristics.

Multiple functional elements may be built inside the side wall of the area (hole 21) where the Si substrate has been removed.

Next, the method for manufacturing of compound semiconductor device 100 according to the present embodiment will be described with reference to FIGS. 3 to 8.

Figure 3:
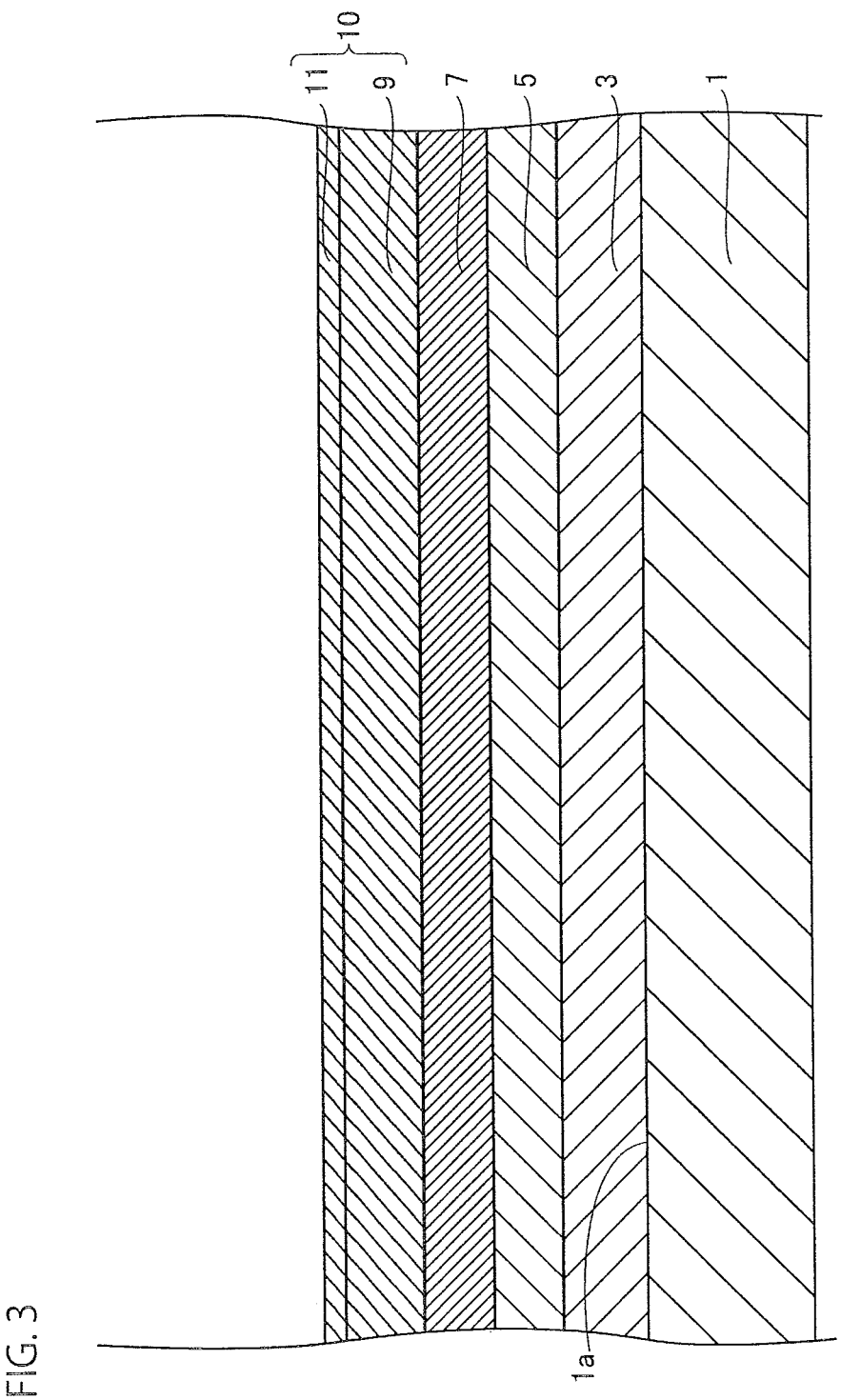
FIG. 3 shows a cross-sectional view indicating the first step of the method for manufacturing of compound semiconductor device 100 in the first embodiment of the present invention.

With reference to FIG. 3, for example, a disc-shaped (hole 21 (FIG. 1) is not formed) Si substrate 1 is prepared. Then, SiC layer 3, AlN buffer layer 5, AlGaN buffer layer 7, GaN layer 9, and AlGaN layer 11 are formed in this order on the top surface 1a of Si substrate 1.

SiC layer 3 may be formed by making SiC homo epitaxial growth on a foundation layer consisting of SiC obtained by carbonizing top surface 1a of Si substrate 1, by using the MBE (Molecular Beam Epitaxy) method, the CVD (Chemical Vapor Deposition) method, the LPE (Liquid Phase Epitaxy) method, etc. SiC layer 3 may be formed only by carbonizing the surface of Si substrate 1. Further, SiC layer 3 may be formed by making SiC hetero epitaxial growth on the surface of Si substrate 1. Note that a buffer layer may be formed prior to the above hetero epitaxial growth.

MN buffer layer 5 is formed using, for example, the MOCVD (Metal Organic Chemical Vapor Deposition) method. The growth temperature of AlN buffer layer 5 is, for example, 1000 degrees Celsius or more and less than the Si melting point. At this time, Al source gas, for example, TMA (Tri Methyl Aluminum), TEA (Tri Ethyl Aluminum), DMAH (Di Methyl Aluminum Hydride), etc. are used. For example, $NH_3$ (ammonia) is used as nitrogen source gas.

AlGaN buffer layer 7 is formed using, for example, the MOCVD method. The growth temperature of AlGaN buffer layer 7 is, for example, 1000 degrees Celsius or more and less than the Si melting point. At this time, for example, TMA, TEA or the like are used as Al source gas. For example, TMG (Tri Methyl Gallium), TEG (Tri Ethyl Gallium), or the like is used as Ga source gas. For example, $NH_3$ is used as nitrogen and source gas.

GaN layer 9 is formed using, for example, the MOCVD method. The growth temperature of GaN layer 9 is, for example, 900 degrees Celsius or more and 1200 degrees Celsius or less. At this time, for example, TMG, TEG, or the like is used as Ga source gas. For example, $NH_3$ is used as nitrogen and source gas.

AlGaN layer 11 is formed by, for example, the MOCVD method, the MBE method, or the like.

Figure 4:
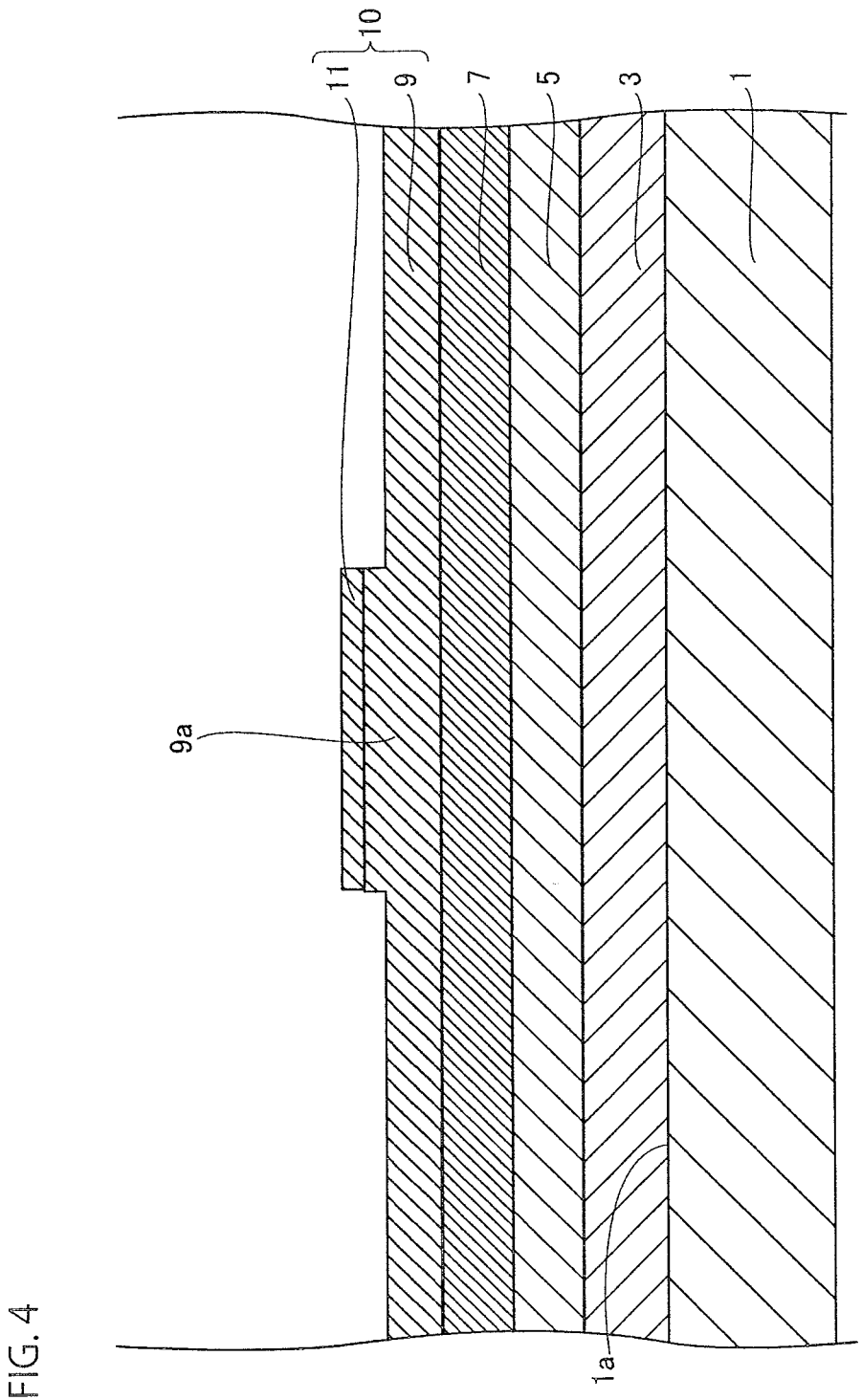
FIG. 4 shows a cross-sectional view indicating the second step of the method for manufacturing of compound semiconductor device 100 in the first embodiment of the present invention.

With reference to FIG. 4, then etching is performed from the top surface side of AlGaN layer 11 to remove AlGaN layer 11 and GaN layer 9 in the required area. As a result, protruding part 9a is formed in GaN layer 9 and the extra AlGaN layer 11 existing other than the top surface of protruding part 9a is removed.

Figure 5:
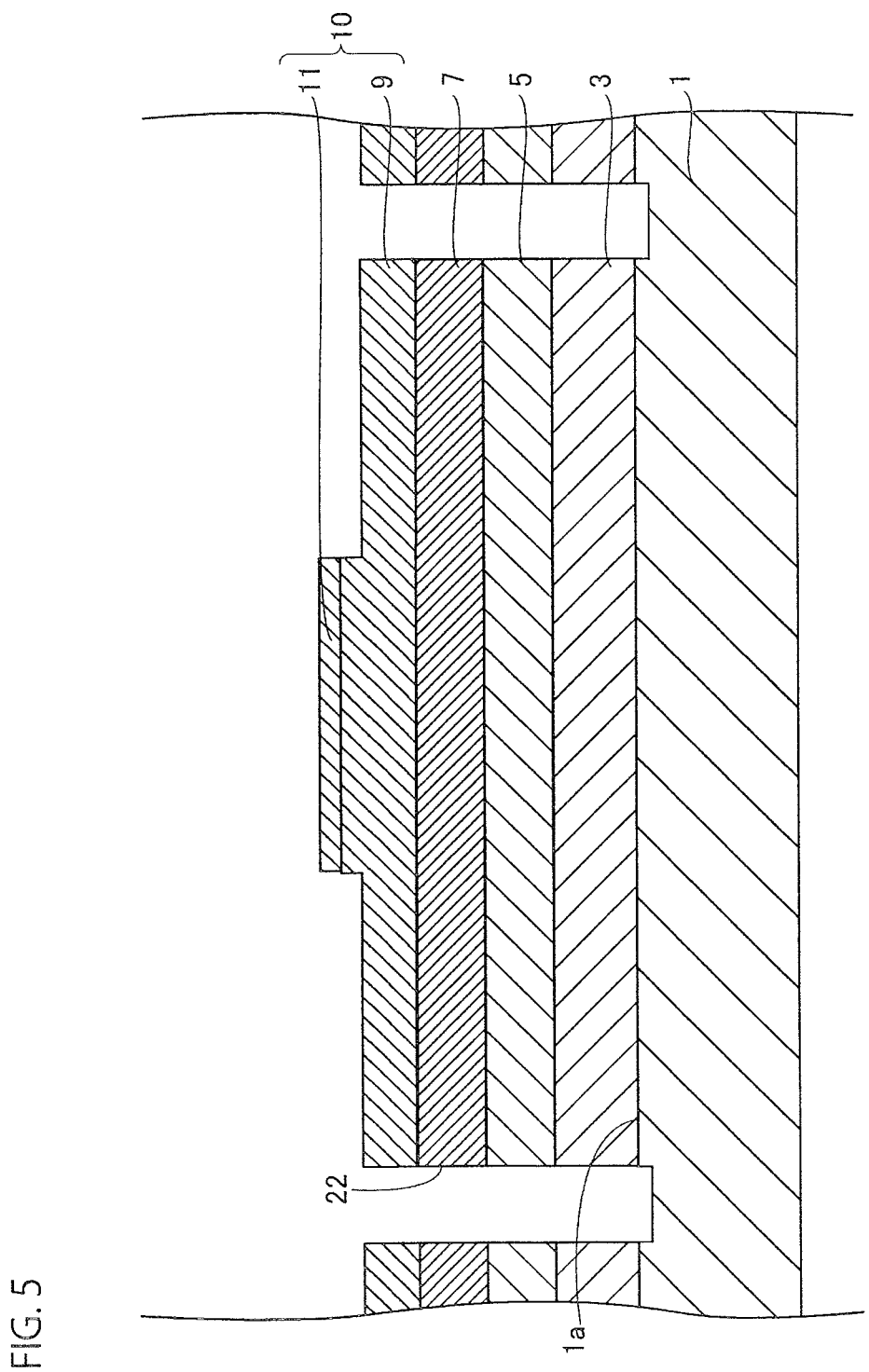
FIG. 5 shows a cross-sectional view indicating the third step of the method for manufacturing of compound semiconductor device 100 in the first embodiment of the present invention.

With reference to FIG. 5, then separation trench 22 is formed from the top surface of GaN layer 9 to the top surface 1a of Si substrate 1. Separation trench 22 is formed by methods such as mechanical grinding and etching.

Figure 6:
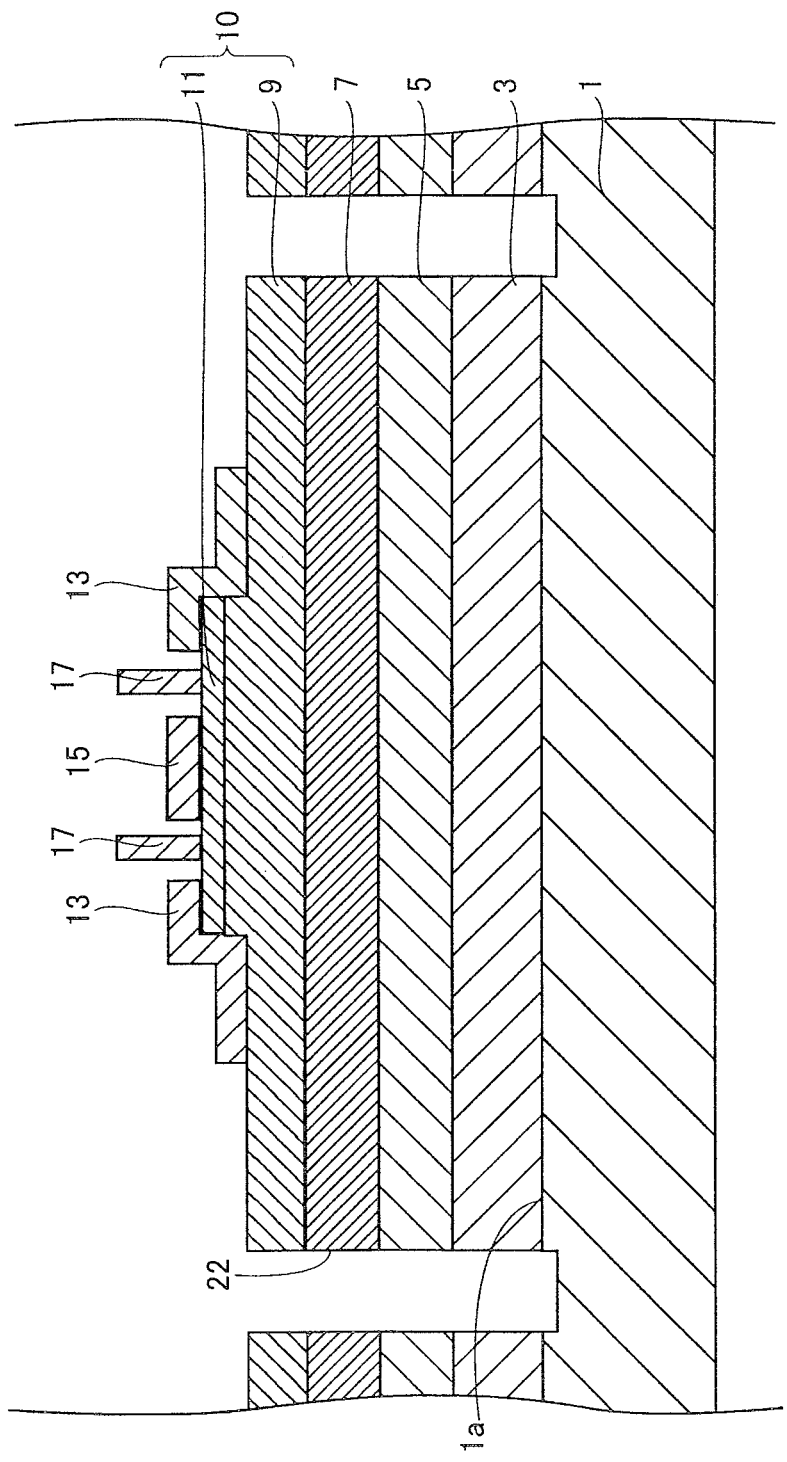
FIG. 6 shows a cross-sectional view indicating the fourth step of the method for manufacturing of compound semiconductor device 100 in the first embodiment of the present invention.

With reference to FIG. 6, then using normal photoengraving and etching techniques, each of source electrode 13 and drain electrode 15 is formed in the required region of each top surface of AlGaN layer 11 and GaN layer 10. Next, using normal photoengraving and etching techniques, gate electrode 17 is formed in the required area of each top surface of AlGaN layer 11 and GaN layer 10. Each of source electrode 13, drain electrode 15, and gate electrode 17 is formed by, for example, the deposition method, the MOCVD method, or the sputtering method.

Figure 7:
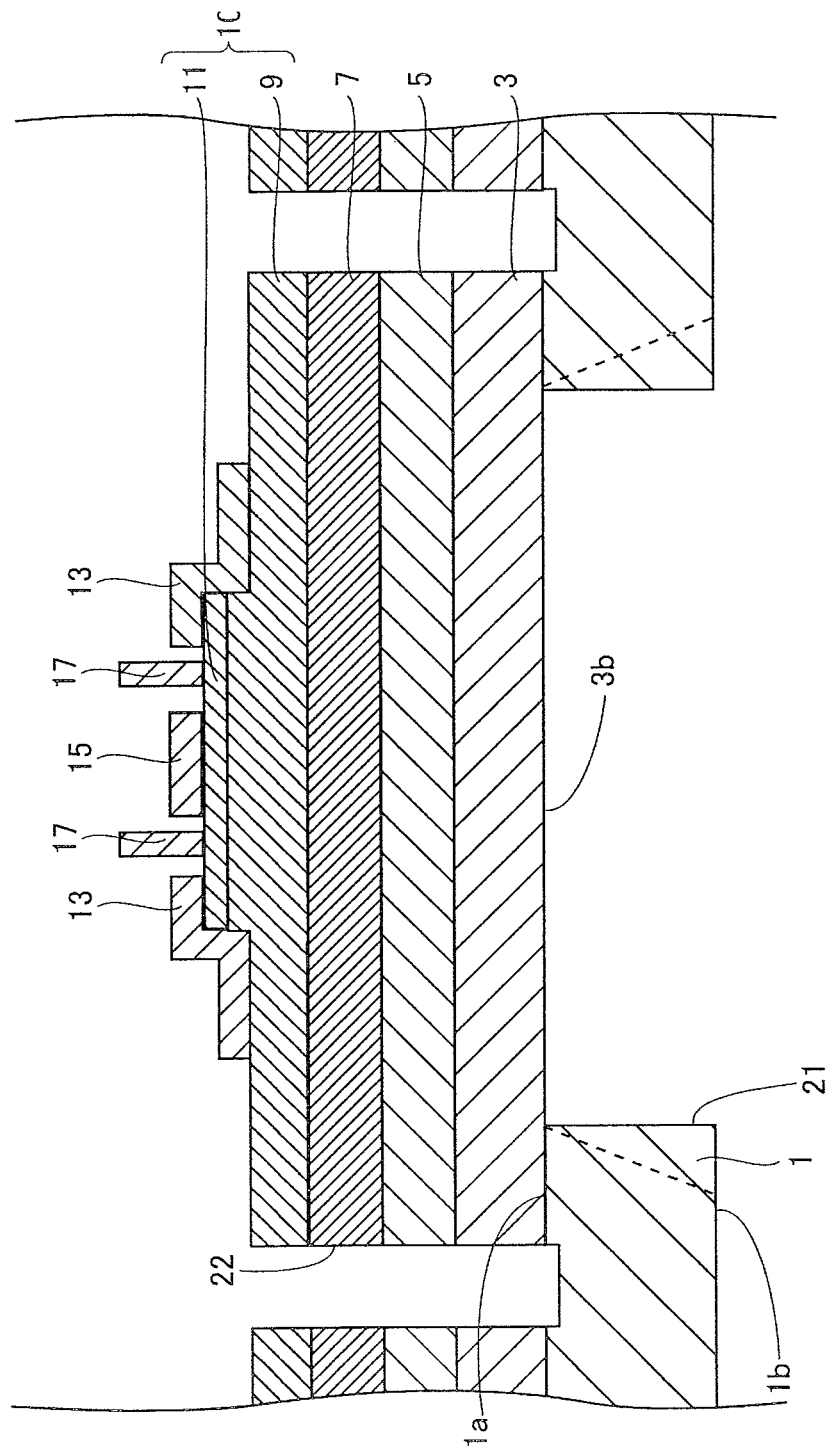
FIG. 7 shows a cross-sectional view indicating the fifth step of the method for manufacturing of compound semiconductor device 100 in the first embodiment of the present invention.

With reference to FIG. 7, then the hole 21 is formed by removing the Si from the central part of the bottom surface 1b in Si substrate 1. The removal of Si is performed by mechanically grinding the Si on Si substrate 1. Further, the removal of Si may be carried out by forming a photoresist in a ring shape on the bottom surface 1b of the Si substrate 1 and etching the Si of the Si substrate 1 with the formed photoresist as a mask. Furthermore, the Si removal may be performed by a combination of multiple methods such as mechanical grinding and wet etching. As a result of the removal of Si, the bottom surface 3b of SiC layer 3 is exposed at the bottom of hole 21. As the final step to expose bottom surface 3b of SiC layer 3, the method using wet etching or dry etching is preferable. Prior to the above-mentioned Si removal step, it is desirable to form or attach a protective layer to the surface on the side which electrodes are formed. As the protective layer, there are photoresist, a polyimide coating agent, a polyimide film, a PVC film, etc. The above-mentioned protective film is peeled off after the hole was formed or during the hole formation (after mechanical grinding, etc.). After the peeling, the electrodes formed surface is cleaned, by such as organic cleaning, if necessary.

In particular, when hole 21 is formed by wet etching, Si substrate 1 is isotopically etched. As a result, as shown by the dotted line in FIG. 7, the inner wall surface of hole 21 in Si substrate 1 is inclined, and the width of Si substrate 1 (the length in the horizontal direction in FIG. 7) becomes narrower as the distance from SiC layer 3 increases.

Note that hole 21 may be formed at any time after the formation of SiC layer 3. After forming hole 21, each of source electrode 13, drain electrode 15, and gate electrode 17 may be formed.

Figure 8:
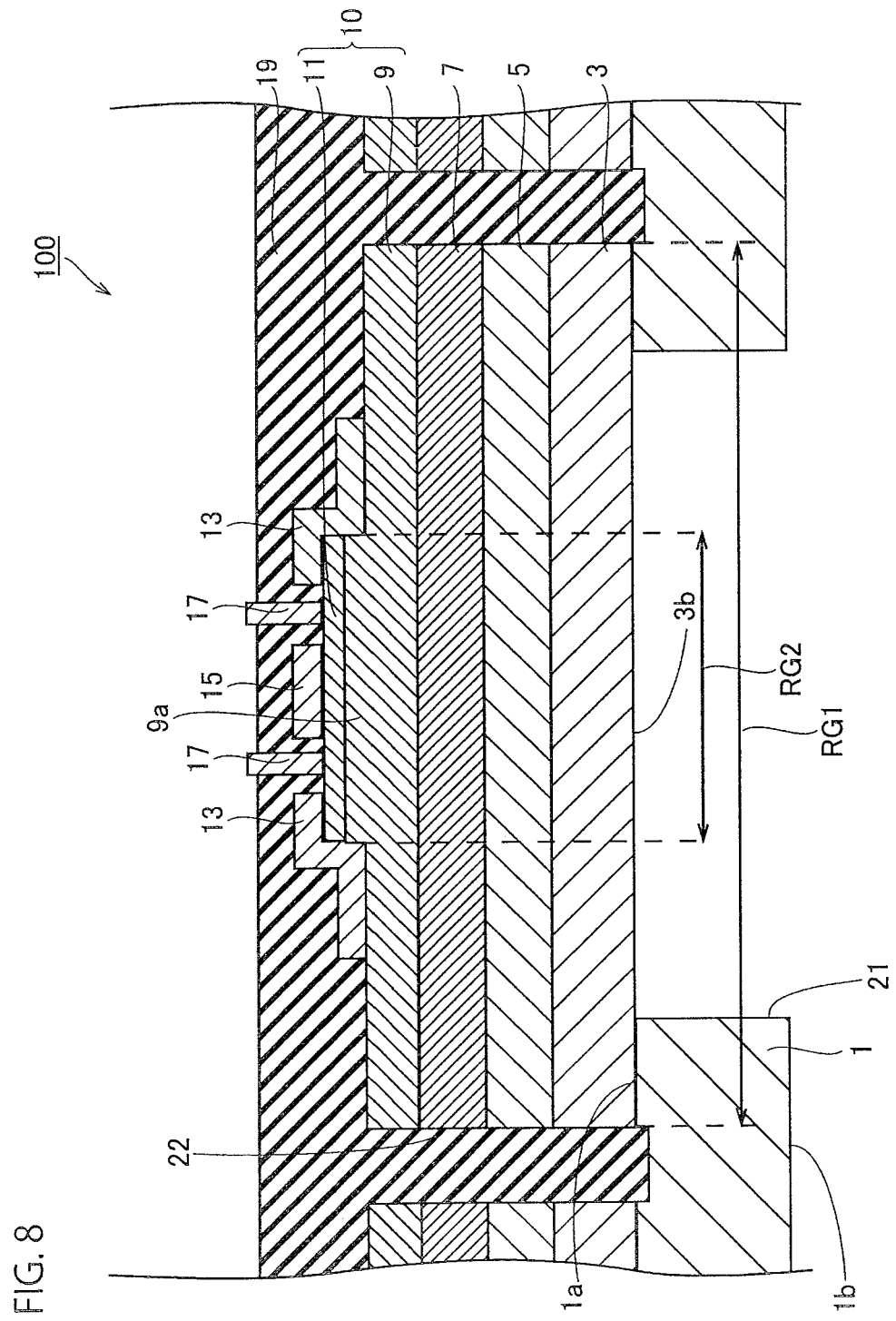
FIG. 8 shows a cross-sectional view indicating the sixth step of the method for manufacturing of compound semiconductor device 100 in the first embodiment of the present invention.

With reference to FIG. 8, the inside of the separation trench 22 is then filled to form an insulation layer 19 so as to cover each of the GaN layer 9, AlGaN layer 11, source electrode 13, and drain electrode 15.

With reference to FIG. 2, the opening 19a is then formed in the required area of insulation layer 19, using normal photoengraving and etching techniques, and the compound semiconductor device 100 shown in FIG. 1 and FIG. 2 is completed.

The inside of separation trench 22 does not have to be filled with an insulation layer. Separation trench 22 does not necessarily have to be formed. Instead of forming separation trench 22, ion implantation may be performed on the nitride layer in the region, thereby increasing the resistance of the region and the region may be a separating layer.

Next, the effect of this embodiment will be described.

Ga nitride layer 10 consists of ionic crystals, and atoms in Ga nitride layer 10 are connected to each other by electrical attraction. Generally, ionic crystals have a hard property, but has a cleavability (weak and fragile property). For this reason, when an external force is applied to Ga nitride layer 10, cracks are likely to occur in Ga nitride layer 10. On the other hand, SiC layer 3 consists of covalent crystals, and atoms in SiC layer 3 is covalently bonded to each other. In general, covalent crystals have low cleavage, and the principle of crack generation in covalent crystals is different from that of crack generation to ionic crystals. As a result, the occurrence of cracks to Ga nitride layer 10 is suppressed by SiC layer 3, and the mechanical strength of compound semiconductor device 100 can be improved.

Here, crystals composed of only typical non-metal elements excluding hydrogen, halogen group elements, and rare gas elements are defined as covalent bond crystals. That is, crystals consisting only of B (boron), C (carbon), Si (silicon), N (nitrogen), P (phosphorus), As (arsenic), O (oxygen), S (sulfur), Se (selenium), and Te (tellurium) are defined as covalent bond crystals.

SiC layer 3 is supported from below by Si substrate 1 with a ring-like planar shape. For this reason, the mechanical strength of SiC layer 3 can be reinforced by Si substrate 1, and the mechanical strength of compound semiconductor device 100 can be improved.

In manufacturing process, in the case of the step (the step in FIG. 7) where hole 21 is formed in Si substrate 1 and SiC layer 3 is exposed at the bottom of hole 21, SiC layer 3 is supported by Si substrate 1 with a ring-like planar shape. For this reason, the mechanical strength of SiC layer 3 can be reinforced by Si substrate 1, and it is possible to suppress the occurrence of cracks to SiC layer 3 during the formation of hole 21. As a result, the manufacturing yield of compound semiconductor device 100 can be improved.

As described above, the mechanical strength of compound semiconductor device 100 can be improved, and the yield during manufacturing of compound semiconductor device 100 can be improved. Therefore, the size of hole 21 can be expanded, and a large-area device can be realized above the structure where the Si substrate is not formed. Devices without a Si substrate have less deterioration of high frequency characteristics during high temperature operation, and the gate width can be increased by large area devices. This can increase the current value at which the devices can be operated. Therefore, it is possible to manufacture devices with little deterioration of high frequency characteristics during a high-temperature operation, and that can be operated with a large current, with a high yield.

In the first embodiment, since Si substrate 1 is removed in the upper region of hole 21, a structure without a lateral current path through the interior of Si substrate 1 is formed. For this reason, in the first embodiment, if AlN buffer layer 5, AlGaN buffer layer 7, and GaN layer 9 are made to be sufficient high resistance layers by doping AlN buffer layer 5, AlGaN buffer layer 7, and GaN layer 9 with C or transition metals, or by not intentionally doping these layers, the parasitic conduction between source electrode 13 and drain electrode 15 of compound semiconductor device 100 can be sufficiently suppressed as compared to the case where hole 21 is not formed. Therefore, the withstand voltage of the device can be improved.

A Modification of the First Embodiment

Figure 9:
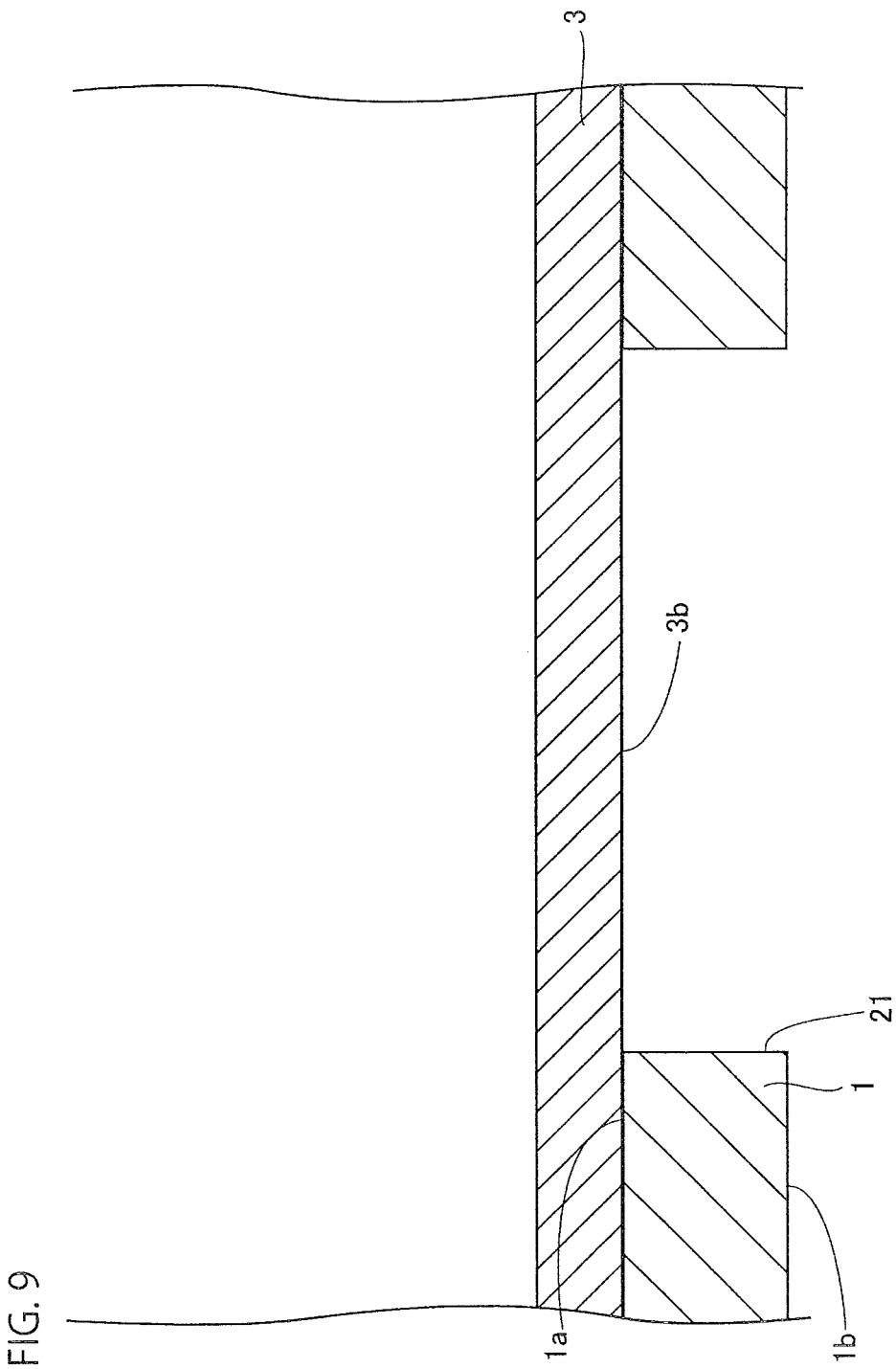
FIG. 9 is a cross-sectional view indicating a method for manufacturing of compound semiconductor device 100 in the first modification of the first embodiment of the present invention.

FIG. 9 shows a cross-sectional view indicating a method for manufacturing of compound semiconductor device 100 in a first modification of the first embodiment of the present invention.

With reference to FIG. 9, the first modification is the modification of the method for manufacturing of the compound semiconductor device 100 of the embodiment described above. In the first modification, after forming SiC layer 3 and before forming Ga nitride layer 10 etc., by removing Si in the central part of bottom surface 1b of Si substrate 1, multiple holes 21 are formed.

As described above, SiC layer 3 is supported by Si substrate 1 with a ring-like planar shape, and The mechanical strength of SiC layer 3 is reinforced by Si substrate 1. Even before forming Ga nitride layer 10, Si substrate 1 and SiC layer 3 have sufficient mechanical strength, and it is possible to suppress the occurrence of cracks to SiC layer 3. As a result, It is possible to realize a structure in which a plurality of holes 21 are formed on the top surface of the Si substrate and the SiC layer exposed at the bottom of each of the plurality of holes 21 is not damaged.

In terms of suppressing the occurrence of cracks to SiC layer 3 as much as possible, as in the embodiment described above, it is preferable to form hole 21 after forming Ga nitride layer 10, etc. This is because hole 21 can be formed with the mechanical strength of SiC layer 3 reinforced by Si substrate 1 and Ga nitride layer 10 etc.

Figure 10:
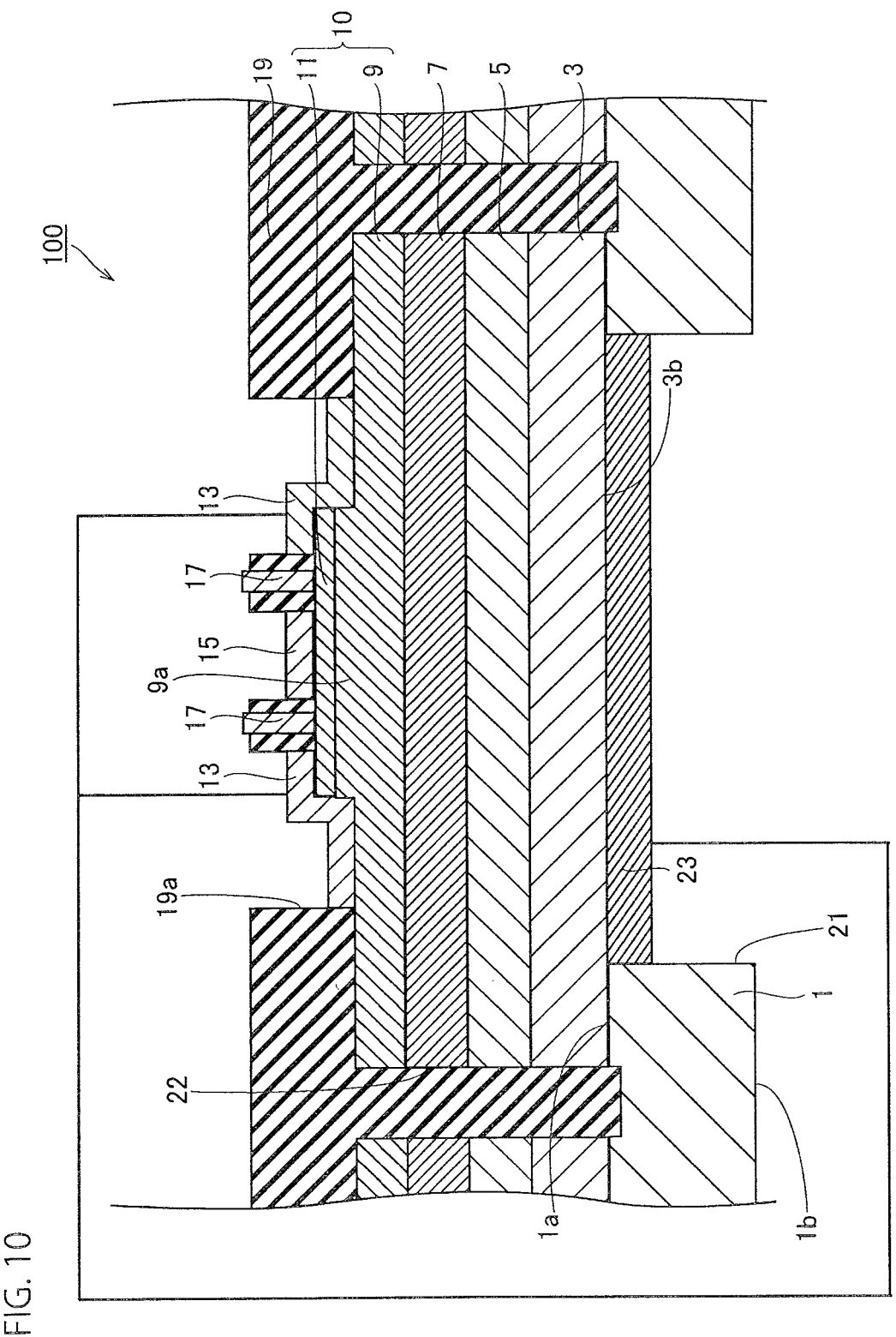
FIG. 10 is a cross-sectional view showing the configuration of compound semiconductor device 100 in the second modification of the first embodiment of the present invention.

FIG. 10 is a cross-sectional view showing the configuration of compound semiconductor device 100 in the second modification of the first embodiment of the present invention.

Referring to FIG. 10, compound semiconductor device 100 in the second modification differs from compound semiconductor device in the above-described embodiment shown in FIGS. 1 and 2 in that it further comprises metal layer 23 (an example of a metal layer). Metal layer 23 is formed at least at the bottom of hole 21 and is in contact with bottom surface 3b of SiC layer 3. Metal layer 23 is electrically connected to source electrode 13. Metal layer 23 is preferably grounded. metal layer 23 is formed by, for example, a deposition method, the MOCVD method, or a sputtering method.

When electrically connecting metal layer 23 and source electrode 13, it is preferable to form a via hole in the substrate to connect metal layer 23 and source electrode 13, and embed metal in it for connection.

Metal layer 23 may be electrically connected to drain electrode 15 instead of source electrode 13.

The configuration of compound semiconductor device 100 of the second modification other than the above is the same as the configuration of the compound semiconductor device of the first embodiment shown in FIG. 1. Therefore, the same member is given the same numeral and the description will not be repeated.

According to the second modification, metal layer 23 is provided directly under the semiconductor device. By grounding this metal layer, a ground plane (electrical ground) that can prevent the loss of high-frequency power is formed directly under the device. Specific resistance of SiC layer 3, AlN buffer layer 5, AlGaN buffer layer 7, and GaN layer 9 is set to a value outside the range of specific resistance where power loss is large. Parasitic capacity and parasitic resistance can be reduced by combining it with metal layer 23, and a HEMT with good high frequency characteristics can be achieved.

Second Embodiment

Figure 11:
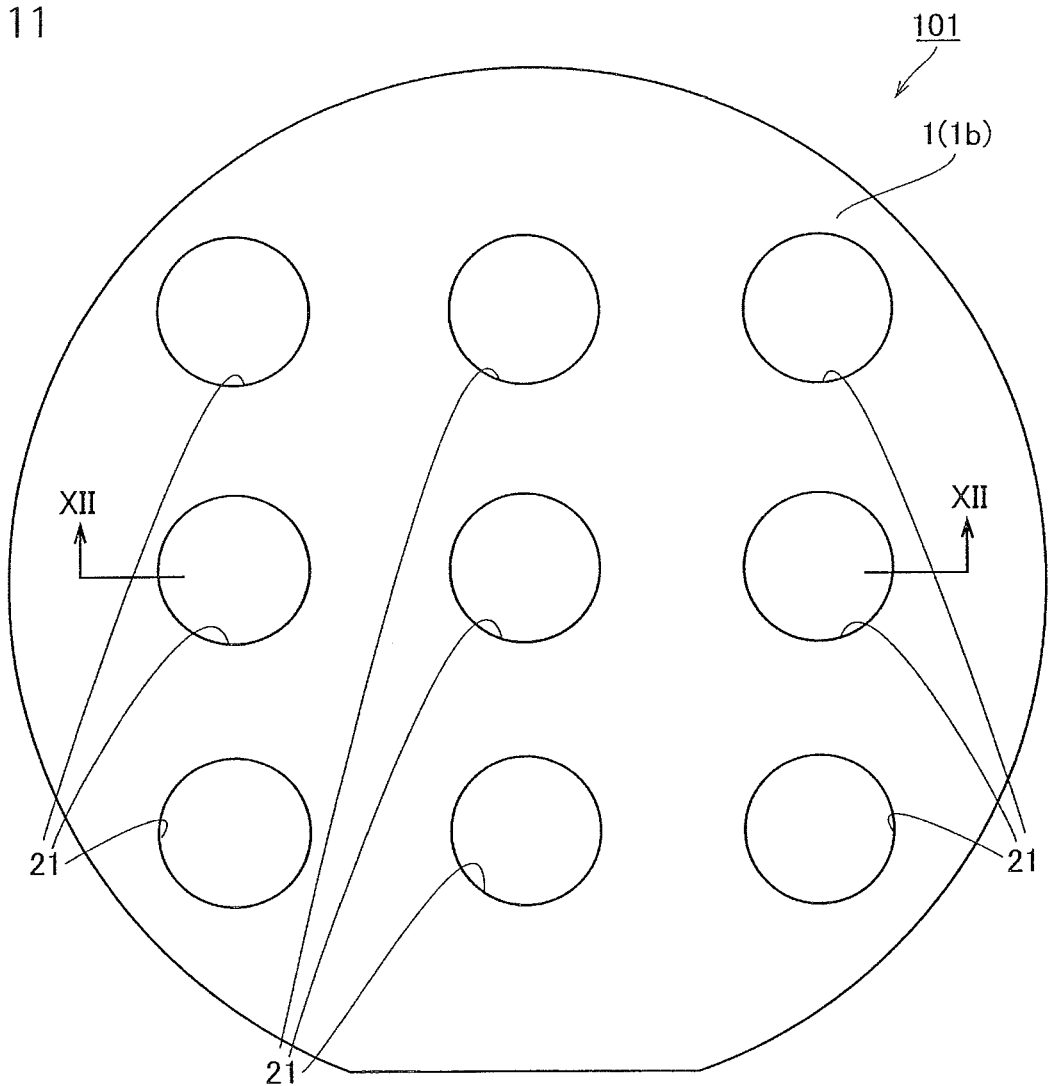
FIG. 11 shows a plan view showing the configuration of compound semiconductor substrate 101 in the second embodiment of the present invention, when viewed from the bottom surface side of Si substrate 1.
Figure 12:
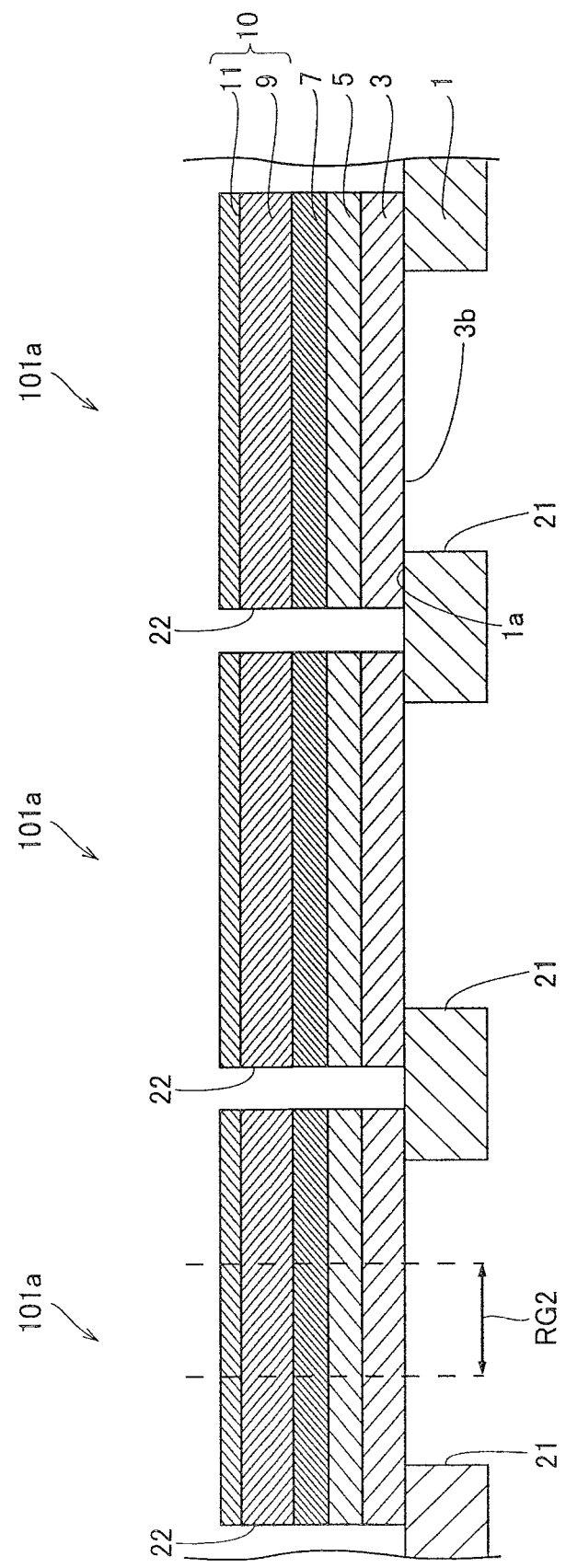
FIG. 12 is a cross-sectional view showing the configuration of compound semiconductor substrate 101 in the second embodiment of the present invention along the XII-XII line of FIG. 11.

FIG. 11 shows the plan view showing the configuration of the compound semiconductor substrate 101 in the second embodiment of the present invention, when viewed from the bottom surface side of the Si substrate 1. FIG. 12 is a cross-sectional view showing the configuration of compound semiconductor substrate 101 in the second embodiment of the present invention, view along the XII-XII line of FIG. 11.

Referring to FIGS. 11 and 12, the compound semiconductor substrate 101 (an example of a compound semiconductor substrate) in the present embodiment contains a plurality of intermediary body constructions 101a which are structures appearing in the process of manufacturing the compound semiconductor device in the first embodiment. Compound semiconductor substrate 101 has Si substrate 1 with a planar size (diameter) of about 2 to 12 inches, more preferably 4 to 8 inches, SiC layer 3, AlN buffer layer 5, AlGaN buffer layer 7 and GaN layer 9. Si substrate 1 has a shape that surrounds the holes (through holes for the Si substrate) 21 when viewed in a plane (from the direction orthogonal to top surface 1a of Si substrate). Intermediary body construction 101a is provided for each of multiple holes 21. SiC layer 3, AlN buffer layer 5, AlGaN buffer layer 7, and GaN layer 9 are formed on the top surface 1a of Si substrate 1 in this order. In particular, SiC layer 3 is formed on top surface 1a of Si substrate 1 and covers multiple holes 21. Bottom surface 3b of SiC layer 3 is exposed at the bottoms of multiple holes 21. The sizes and shapes of the multiple holes 21 may be same or different from each other.

According to compound semiconductor substrate 101 of this embodiment, AlGaN layer 11 and GaN layer 9 in the required area are removed. Each of source electrode 13, drain electrode 15, and gate electrode 17 is formed. Insulation layer 11 is formed and required groove 11a is formed. As a result, multiple compound semiconductor devices 100 are obtained.

Separation trench 22 does not have to be formed in compound semiconductor substrate 101 (That is, separation trench 22 may be formed after the completion of compound semiconductor substrate 101). The compound semiconductor substrate 101 may further include the source electrode 13, drain electrode 15, and gate electrode 17 shown in FIG. 1. In this case, hole 21 exists in the area where source electrode 13, drain electrode 15, and gate electrode 17 overlap the area when viewed from the direction orthogonal to top surface 1a of Si substrate 1, and Si substrate 1 does not exist in the area. Compound semiconductor substrate 101 should have at least Si substrate 1 and SiC layer 3.

Since the configuration of compound semiconductor substrate 101 other than the above is the same as the configuration of compound semiconductor device 100 in the first embodiment, the description will not be repeated.

According to this embodiment, compound semiconductor substrate 101 contains multiple intermediary body constructions 101. Therefore, the same effect as the compound semiconductor device in the first embodiment can be obtained. In particular, since SiC layer 3 is supported from below by Si substrate 1, occurrence of cracks to SiC layer 3 and Ga nitride layer 10 at the time of manufacture is suppressed, and the exposed SiC layer 3 on the bottom of each of the multiple holes 21 is undamaged. For this reason, the yield at the time of manufacturing can be improved. Dust should not be generated during the formation step of source electrode 13, drain electrode 15, and gate electrode 17 and the formation step of separation trench 22. Therefore, these steps are performed in a clean environment, such as a clean room. In compound semiconductor substrate 101 shown in FIGS. 10 and 11, if the SiC layer 3 exposed at the bottom of even one of multiple holes 21 is damaged, dust will be generated from the damaged part and pollute the clean room environment. For this reason, it is industrially very difficult to put the above-mentioned damaged compound semiconductor substrate into a clean room to form electrodes and separation trench 22, from the viewpoint of maintaining a clean environment such as a clean room. Therefore, in compound semiconductor substrate 101, it is essential requirements that none of the exposed SiC layer 3 on the bottom of each of the multiple holes 21 is damaged, to industrially realize compound semiconductor device 100 shown in FIG. 1 and FIG. 2.

[Others]

In the above embodiments, the case where a wide gap semiconductor layer including Ga (a semiconductor layer with a band gap of 2.2 eV or higher) is Ga nitride layer 10 is shown. However, a wide gap semiconductor layer including Ga may be an oxide such as $Ga_2O_3$ as well as nitride such as GaN. $Ga_2O_3$ has a larger band gap energy than SiC and GaN, and is expected as a next-generation compound. $Ga_2O_3$ has better withstand voltage characteristics than GaN, and a compound semiconductor device which adopted $Ga_2O_3$ as a wide gap semiconductor layer including Ga is suitable for power devices. On the other hand, since GaN has higher mobility than $Ga_2O_3$, a compound semiconductor device which adopted GaN as a wide gap semiconductor layer including Ga is suitable for high frequency device.

In the above embodiments, the case where a compound semiconductor device includes a HEMT as a semiconductor device is shown. However, a compound semiconductor device may include a MOSFET (Metal-Oxide-Semiconductor Field-Effect Transistor), a MISFET (Metal-Insulator-Semiconductor Field-effect Transistor), a JFET (Junction Field Effect Transistor), or the like as a semiconductor device. Further, a compound semiconductor device can also be a vertical type device that allows current to flow in the thickness direction of the nitride semiconductor layer.

The above embodiments and modifications can be combined as appropriate.

The embodiments and modifications described above should be considered in all respects as exemplary and not restrictive. The scope of the present invention is indicated by the claims rather than the above description and is intended to include the claims and all changes within the meaning and scope of the equivalent.

EXPLANATION OF SYMBOLS

1 Si (silicon) substrate (an example of a Si substrate)
1a top surface of Si substrate
1b bottom surface of Si substrate
3 SiC (silicon carbide) layer (an example of a crystal layer)
3b bottom surface of SiC layer
5 AlN (aluminum nitride) buffer layer (an example of nitride layer that do not include Ga)
7 AlGaN (aluminum nitride gallium) buffer layer
9 GaN (gallium nitride) layer
9a protruding part of GaN layer
10 Ga (gallium) nitride layer (an example of wide gap semiconductor layer)
11 AlGaN layer
13 source electrode (an example of a first electrode)
15 drain electrode (an example of a second electrode)
17 gate electrode (an example of a third electrode)
19 insulation layer
19a opening in insulation layer
21 hole (an example of a hole)
22 separation trench
23 metal layer (an example of metal layer)
100 compound semiconductor device (an example of compound semiconductor device)
101 compound semiconductor substrate (an example of compound semiconductor substrate)
101a intermediary body construction
RG1, RG2 element separation area

What is claimed is:

1. A compound semiconductor device comprising:
a Si substrate with a shape that surrounds a hole when viewed in a plane;
a covalent crystal layer formed on a top surface of the Si substrate and covering the hole;
a wide gap semiconductor layer including Ga formed on a top surface side of the crystal layer; and
a first, a second, and a third electrodes formed on a top surface side of the wide gap semiconductor layer, wherein
current flowing between the first electrode and the second electrode can be controlled by voltage applied to the third electrode, and
the Si substrate does not exist in a region that overlaps with the first, second, and third electrodes when viewed from a direction orthogonal to the top surface of the Si substrate,
the compound semiconductor device further comprising
a separation region formed to a depth from the top surface of the wide gap semiconductor layer to a top surface of the Si substrate, wherein the compound semiconductor device is electrically separated from another compound semiconductor device adjacent to the compound semiconductor device by the separation region.

2. The compound semiconductor device according to claim 1, wherein
the crystal layer consists of 3C-SiC.

3. The compound semiconductor device according to claim 2, wherein
a top surface of the crystal layer is (111) plane.

4. The compound semiconductor device according to claim 2, wherein
the crystal layer consists of SiC which includes at least one of a N-type dopant such as nitrogen and phosphorus, a P-type dopant such as Al and B, and transition metal as a dopant that plays semi-insulating, as impurity, and where concentration of N-type dopant is N (pieces/cm$^3$), concentration of P-type dopant is P (pieces/cm$^3$), and concentration of dopant that expresses semi-insulating is I (pieces/cm$^3$), any of the following equations (1) to (3) holds among the concentrations N, P, and I;

$$|N-P| \leq 1*10^{16} \tag{1}$$

$$N+P<I<1*10^{21} \tag{2}$$

$$1*10^{18} \leq |N-P| \leq 1*10^{21} \text{ and } I<N+P \tag{3}.$$

5. The compound semiconductor device according to claim 1, wherein
the crystal layer have a specific resistance of 100 Ωcm or more or 100 m Ωcm or less.

6. The compound semiconductor device according to claim 1, further comprising
a metal layer formed at a bottom of the hole.

7. A compound semiconductor substrate comprising:
a Si substrate with a shape that surrounds multiple holes when viewed in a plane; and
a covalent crystal layer formed on a top surface of the Si substrate and covering the holes, wherein
the crystal layer exposed at a bottom of each of the holes is undamaged.

8. The compound semiconductor substrate according to claim 7 further comprising
a wide gap semiconductor layer including Ga formed on a top surface side of the crystal layer.

9. The compound semiconductor substrate according to claim 8 further comprising
a first, a second, and a third electrodes formed on a top surface side of the wide gap semiconductor layer for each of the multiple holes, wherein current flowing between the first electrode and the second electrode can be controlled by voltage applied to the third electrode, and the Si substrate does not exist in a region that overlaps with the first, second, and third electrodes when viewed from a direction orthogonal to the top surface of the Si substrate.

10. A method for manufacturing of a compound semiconductor device comprising:
- a step of forming a covalent crystal layer on a top surface of a Si substrate;
- a step of forming a wide gap semiconductor layer including Ga on a top surface side of the crystal layer;
- a step of forming a hole on a bottom surface of the Si substrate and exposing the crystal layer at a bottom of the hole; and
- a step of forming a first, a second, and a third electrodes on a top surface side of the wide gap semiconductor layer, wherein current flowing between the first electrode and the second electrode can be controlled by voltage applied to the third electrode, the step that exposes the crystal layer includes a step that etches a portion of the Si substrate, and the step that exposes the crystal layer is performed after the step that forms the wide gap semiconductor layer, the method further comprising a step of forming a separation region formed to a depth from the top surface of the wide gap semiconductor layer to a top surface of the Si substrate, wherein the compound semiconductor device is electrically separated from another compound semiconductor device adjacent to the compound semiconductor device by the separation region.

* * * * *